(12) United States Patent
Brindger et al.

(10) Patent No.: US 12,496,426 B2
(45) Date of Patent: Dec. 16, 2025

(54) MULTI-MODAL DYNAMIC ENTRAINMENT AUGMENTED NEUROFEEDBACK SYSTEM

(71) Applicant: Halo Technology, Inc., Scottsdale, AZ (US)

(72) Inventors: Aaron C. Brindger, Scottsdale, AZ (US); Larry Woodard, Las Vegas, NV (US)

(73) Assignee: Halo Technology, Inc., Scottsdale, AZ (US)

( * ) Notice: Subject to any disclaimer, the term of this patent is extended or adjusted under 35 U.S.C. 154(b) by 0 days.

(21) Appl. No.: 18/614,198

(22) Filed: Mar. 22, 2024

(65) Prior Publication Data

US 2025/0177684 A1   Jun. 5, 2025

Related U.S. Application Data

(60) Provisional application No. 63/491,636, filed on Mar. 22, 2023.

(51) Int. Cl.
| | |
|---|---|
| *A61M 21/02* | (2006.01) |
| *A61B 5/375* | (2021.01) |
| *A61B 5/378* | (2021.01) |
| *A61B 5/38* | (2021.01) |
| *A61M 21/00* | (2006.01) |
| *G16H 10/60* | (2018.01) |
| *G16H 20/70* | (2018.01) |
| *G16H 40/63* | (2018.01) |

(52) U.S. Cl.
CPC ............ *A61M 21/02* (2013.01); *G16H 10/60* (2018.01); *G16H 20/70* (2018.01); *G16H 40/63* (2018.01); *A61M 2021/0027* (2013.01); *A61M 2021/0044* (2013.01); *A61M 2205/052* (2013.01); *A61M 2209/088* (2013.01); *A61M 2210/06* (2013.01); *A61M 2230/10* (2013.01)

(58) Field of Classification Search
CPC .......... A61M 21/02; A61M 2021/0027; A61M 2021/0044; A61M 2205/052; A61M 2209/088; A61M 2210/06; A61M 2230/10; G16H 10/60; G16H 20/70; G16H 40/63

See application file for complete search history.

(56) References Cited

U.S. PATENT DOCUMENTS

| | | | |
|---|---|---|---|
| 10,039,471 B2 | 8/2018 | Hardt | |
| 2011/0105938 A1* | 5/2011 | Hardt | ..................... A61B 5/486 600/544 |

(Continued)

OTHER PUBLICATIONS

International Search Report and Written Opinion for International Application No. PCT/US2024/021188, mailed on Jun. 17, 2024, 13 pages.

*Primary Examiner* — Carrie R Dorna
*Assistant Examiner* — Joshua Daryl D Lannu
(74) *Attorney, Agent, or Firm* — COOLEY LLP

(57) ABSTRACT

A neurofeedback enhancement system incorporating monaural audio beats, optical LED photic entrainment, and nIR LED photobiomodulation entrainment components to augment the EEG neurofeedback process. The frequency of operation for the entrainment modalities is set based on the dominant energy frequency attributes of the subjects EEG. The intensity of the entrainment modalities is dynamically modulated in response to real time analysis of targeted EEG features, and all modalities are synchronized in time.

17 Claims, 9 Drawing Sheets

(56) References Cited

U.S. PATENT DOCUMENTS

| | | |
|---|---|---|
| 2019/0321583 A1 | 10/2019 | Poltorak |
| 2022/0008746 A1* | 1/2022 | Malchano ............ A61B 5/4088 |
| 2022/0273907 A1 | 9/2022 | Poltorak |

* cited by examiner

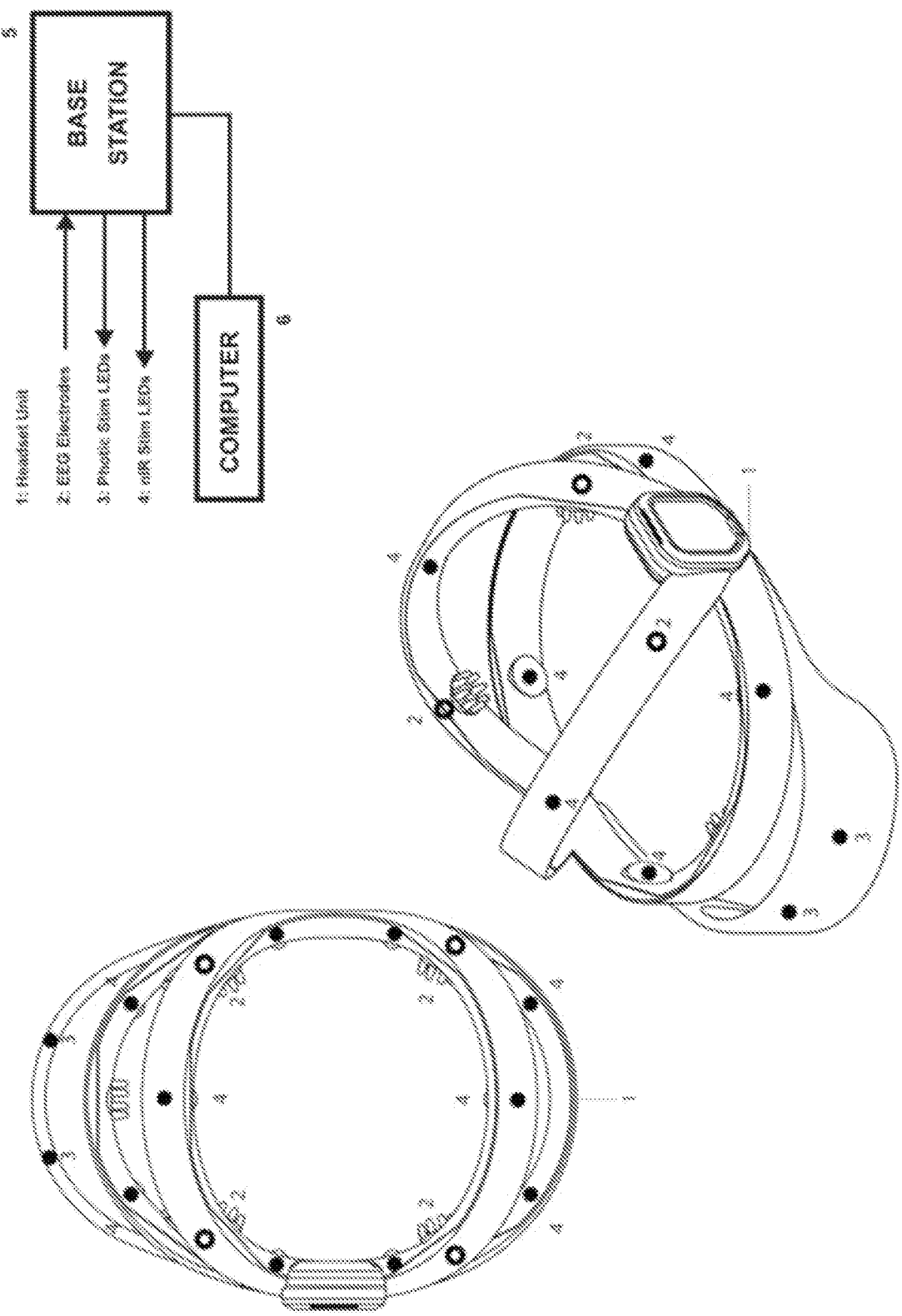
Figure 1A: Integrated Headset System

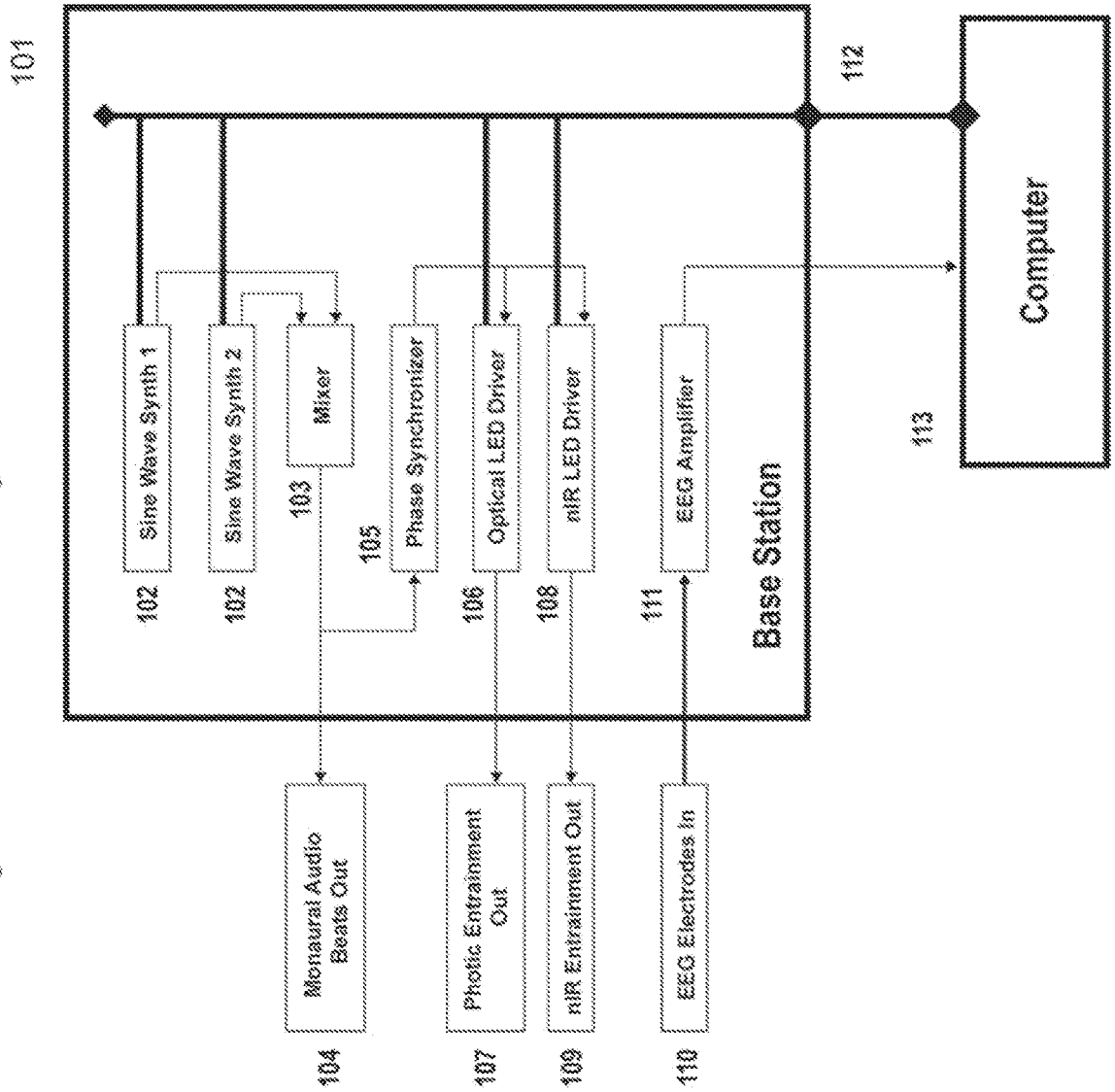
Figure 2: Base Station Design

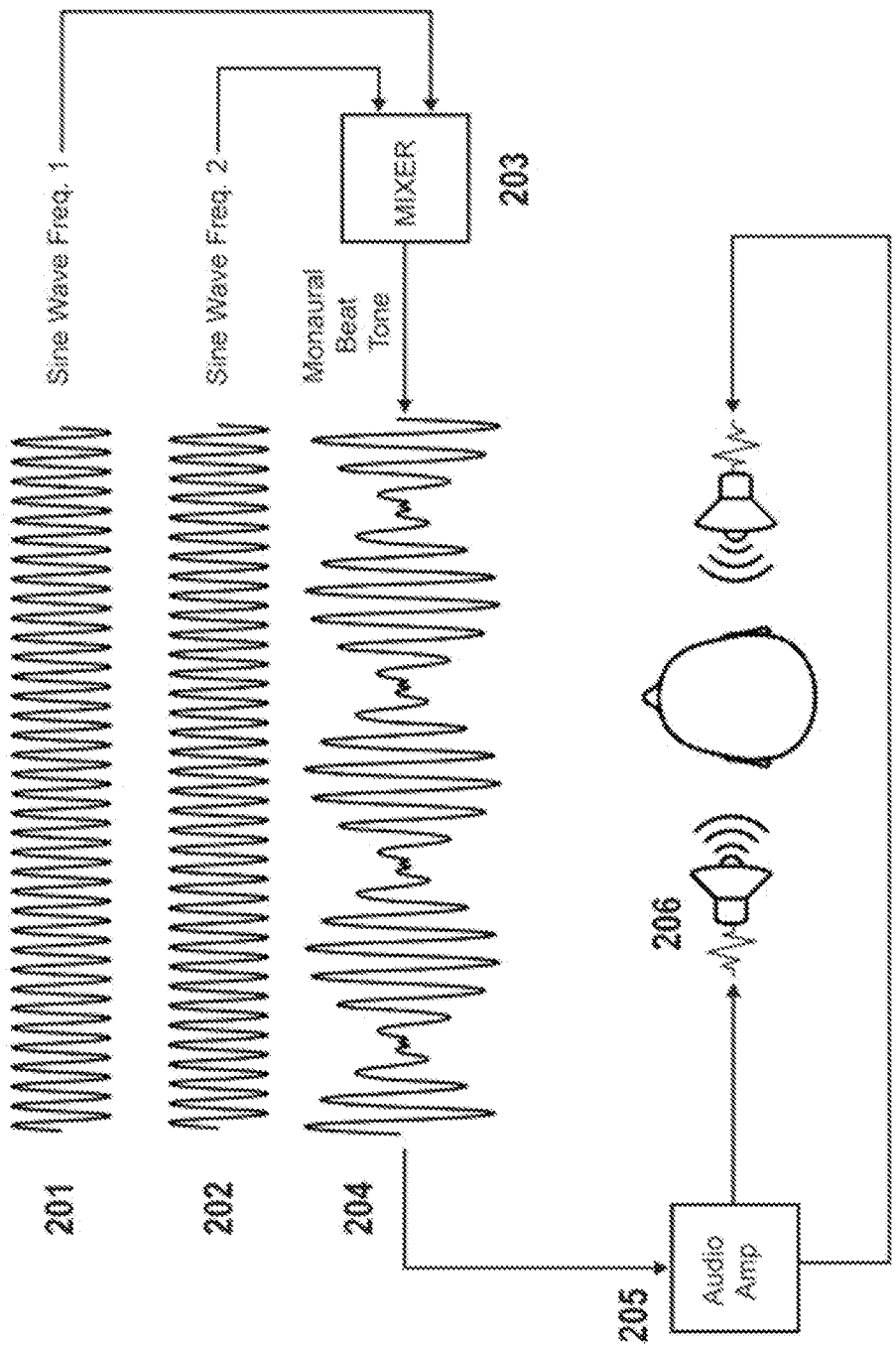
Figure 3: Monaural Beat Tone Generation

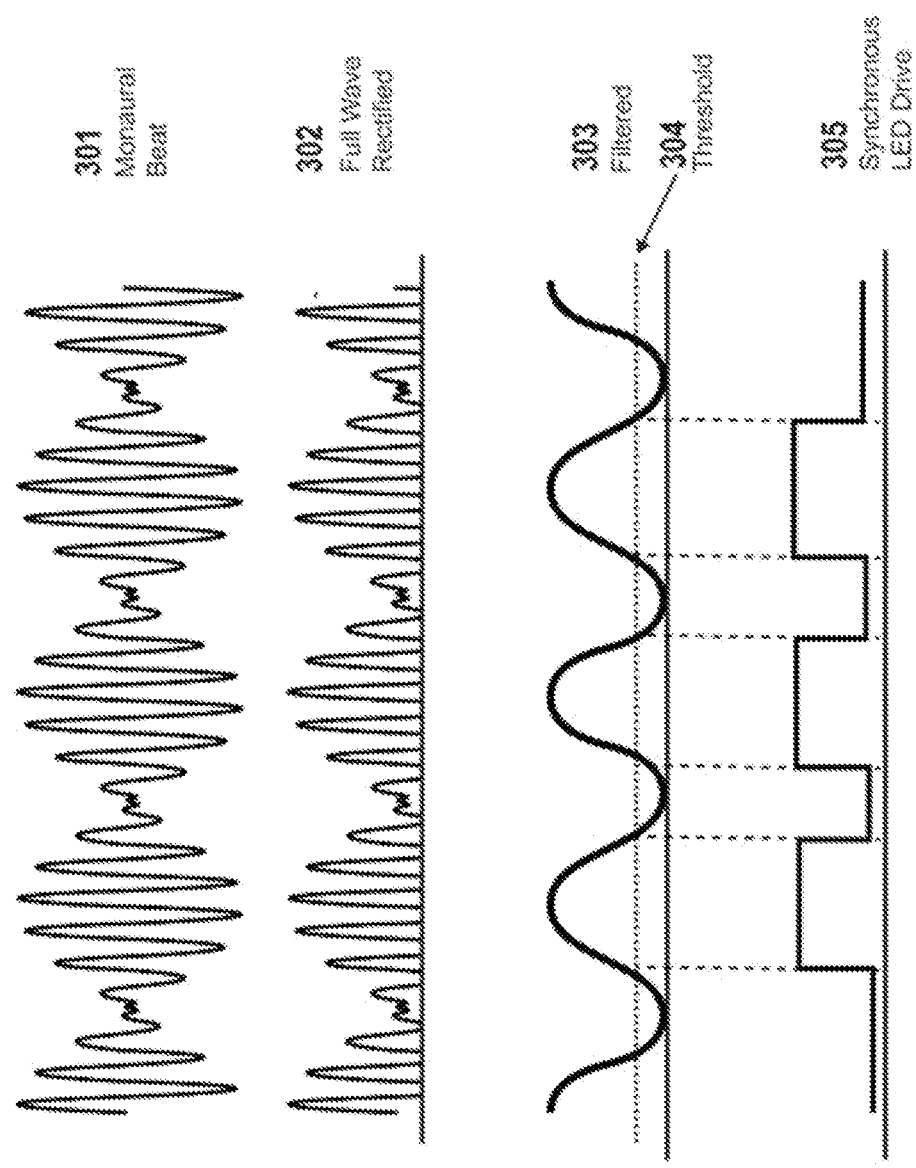

FIGURE 5: Example Schedule of Entrainment Intensities

| % Training Goal | Audio Intensity | Visual Intensity | nIR Intensity |
|---|---|---|---|
| 0% - 25% | 40% | 70% | 80% |
| 26% to 40% | 30% | 55% | 80% |
| 41% to 55% | 20% | 40% | 60% |
| 56% to 70% | 10% | 20% | 40% |
| > 70% | 0% | 0% | 0% |

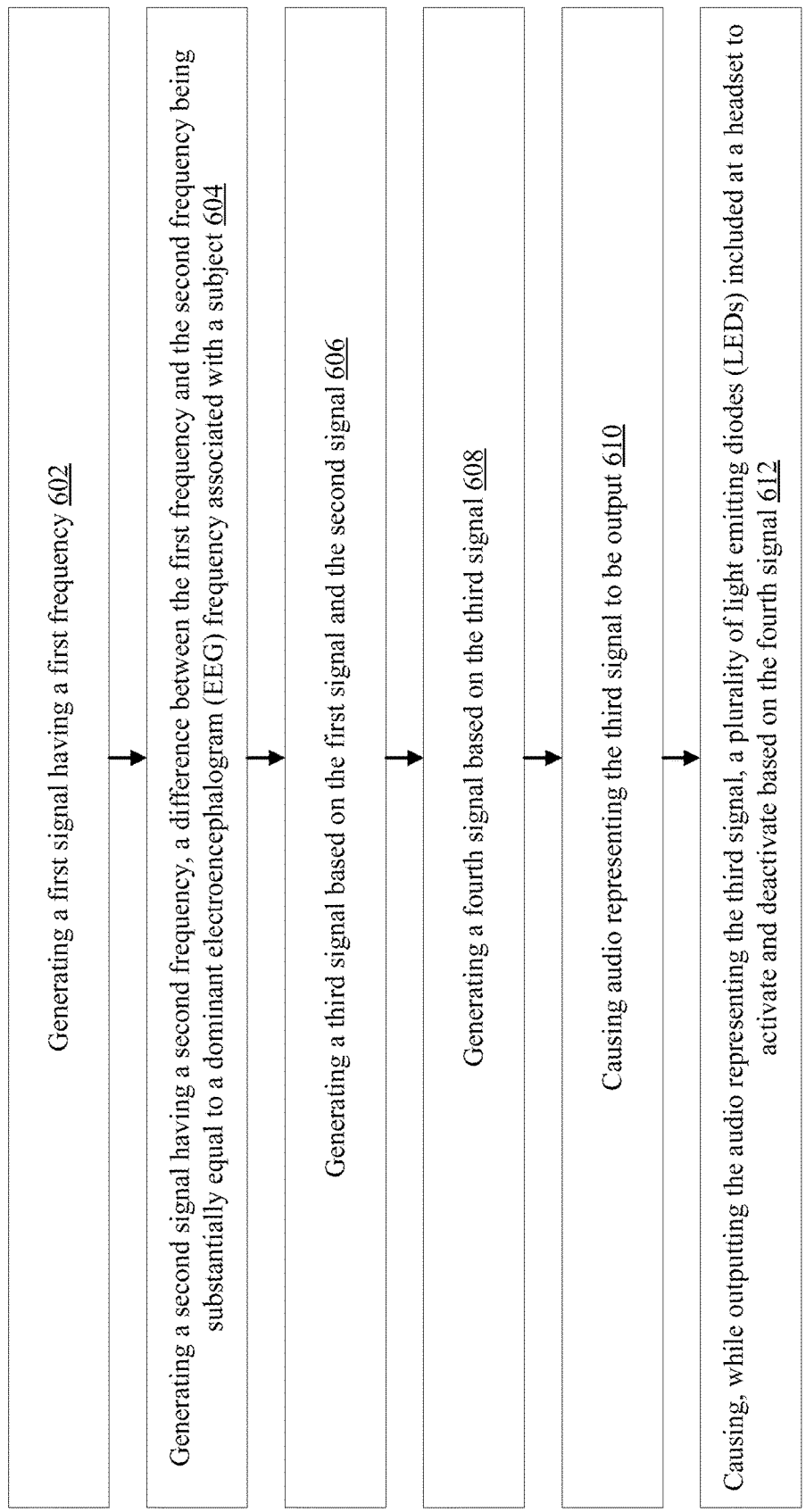

700

Send an audio signal to a speaker to cause the speaker to output audio based on the audio signal, the audio signal generated based on combining a first signal having a first frequency and a second signal having a second frequency, a difference between the first frequency and the second frequency being substantially equal to a dominant electroencephalogram (EEG) frequency associated with a subject 702

Send a light emitting diode (LED) drive signal to a plurality of LEDs to cause the plurality of LEDs to activate based on the LED drive signal, the LED drive signal generated based on peaks associated with the audio signal 704

Send an audio signal to a speaker to cause the speaker to output audio based on the audio signal, the audio signal generated based on a first signal having a first frequency and a second signal having a second frequency, a difference between the first frequency and the second frequency being substantially equal to a dominant electroencephalogram (EEG) frequency associated with a subject 802

Send a light emitting diode (LED) drive signal to a plurality of LEDs to cause the plurality of LEDs to activate based on the LED drive signal, the LED drive signal generated based on the audio signal 804

Figure 8

MULTI-MODAL DYNAMIC ENTRAINMENT AUGMENTED NEUROFEEDBACK SYSTEM

CROSS REFERENCE TO RELATED APPLICATIONS

This application claims priority to U.S. Patent Application No. 63/491,636, filed Mar. 22, 2023 and titled "MULTI-MODAL DYNAMIC ENTRAINMENT AUGMENTED NEUROFEEDBACK SYSTEM," the entire contents of which are incorporated by reference here in its entirety.

FIELD

One or more embodiments relate generally to a multi-modal, dynamic, electroencephalographic (EEG)-driven entrainment apparatus and method for use in the enhancement of the EEG neurofeedback training process.

BACKGROUND

One of the problems that has been experienced by the field of neurofeedback is that to progress in increasing, or learning to control an EEG sub-band, one typically should have some sense of what the subjective state is that they are trying to achieve. So, for example, someone attempting to deal with stress by increasing their alpha activity typically experiences difficulty in the beginning. The very fact that they are suffering from stress is likely associated with a lack of alpha activity in their EEG. This means they have very little subjective experience with what they are trying to achieve actually feels like. As a result, it can often take dozens of sessions or even hundreds of hours of training to make significant progress.

Thus, an opportunity exists to incorporate entrainment technologies into the neurofeedback process to produce an enhancement and acceleration of the training.

SUMMARY

In an embodiment, a method includes generating, via a processor, a first signal having a first frequency. The method further includes generating, via the processor, a second signal having a second frequency. A difference between the first frequency and the second frequency are substantially equal to a dominant electroencephalogram (EEG) frequency associated with a subject. The method further includes generating, via the processor, a third signal based on the first signal and the second signal. The method further includes generating, via the processor, a fourth signal based on the third signal. The method further includes causing, via the processor, audio representing the third signal to be output. The method further includes causing, via the processor and while outputting the audio representing the third signal, a plurality of light emitting diodes (LEDs) included at a headset to activate and deactivate based on the fourth signal.

In an embodiment, an apparatus includes a memory and a processor operatively coupled to the memory. The processor is configured to send an audio signal to a speaker to cause the speaker to output audio based on the audio signal. The audio signal is generated based on combining a first signal having a first frequency and a second signal having a second frequency. A difference between the first frequency and the second frequency are substantially equal to a dominant electroencephalogram (EEG) frequency associated with a subject. The processor is further configured to send a light emitting diode (LED) drive signal to a plurality of LEDs to cause the plurality of LEDs to activate based on the LED drive signal, the LED drive signal generated based on peaks associated with the audio signal.

In an embodiment, a non-transitory processor-readable medium stores code representing instructions to be executed by one or more processors. The instructions comprise code to cause the one or more processors to send an audio signal to a speaker to cause the speaker to output audio based on the audio signal. The audio signal is generated based on a first signal having a first frequency and a second signal having a second frequency. A difference between the first frequency and the second frequency is substantially equal to a dominant electroencephalogram (EEG) frequency associated with a subject. The instructions further comprise code to cause the one or more processors to send a light emitting diode (LED) drive signal to a plurality of LEDs to cause the plurality of LEDs to activate based on the LED drive signal, the LED drive signal generated based on the audio signal.

BRIEF DESCRIPTION OF THE DRAWINGS

FIG. 1A is a diagram of a multi-function custom headset to implement the features discussed herein, according to an embodiment.

FIG. 2 is a system block diagram of a base station processor module, according to an embodiment.

FIG. 3 illustrates waveforms produced in a method of monaural beat audio tone generation, according to an embodiment.

FIG. 4 illustrates waveforms produced in the method of synchronizing the LED entrainment signals to the audio energy peaks of the monaural beat entrainment signal waveform, according to an embodiment.

FIG. 5 illustrates an example of a Schedule of "% of Training Goal" to "Entrainment Intensity", according to an embodiment.

FIG. 6 illustrates a flowchart of a method to generate cause audio output and LED activation/deactivation, according to an embodiment.

FIG. 7 illustrates a flowchart of a method to output audio and activate/deactivate LEDs based on a dominant EEG frequency, according to an embodiment FIG. 8 illustrates a flowchart of a method to output audio and activate/deactivate LEDs based on a dominant EEG frequency, according to an embodiment.

DETAILED DESCRIPTION

Figure 1B:
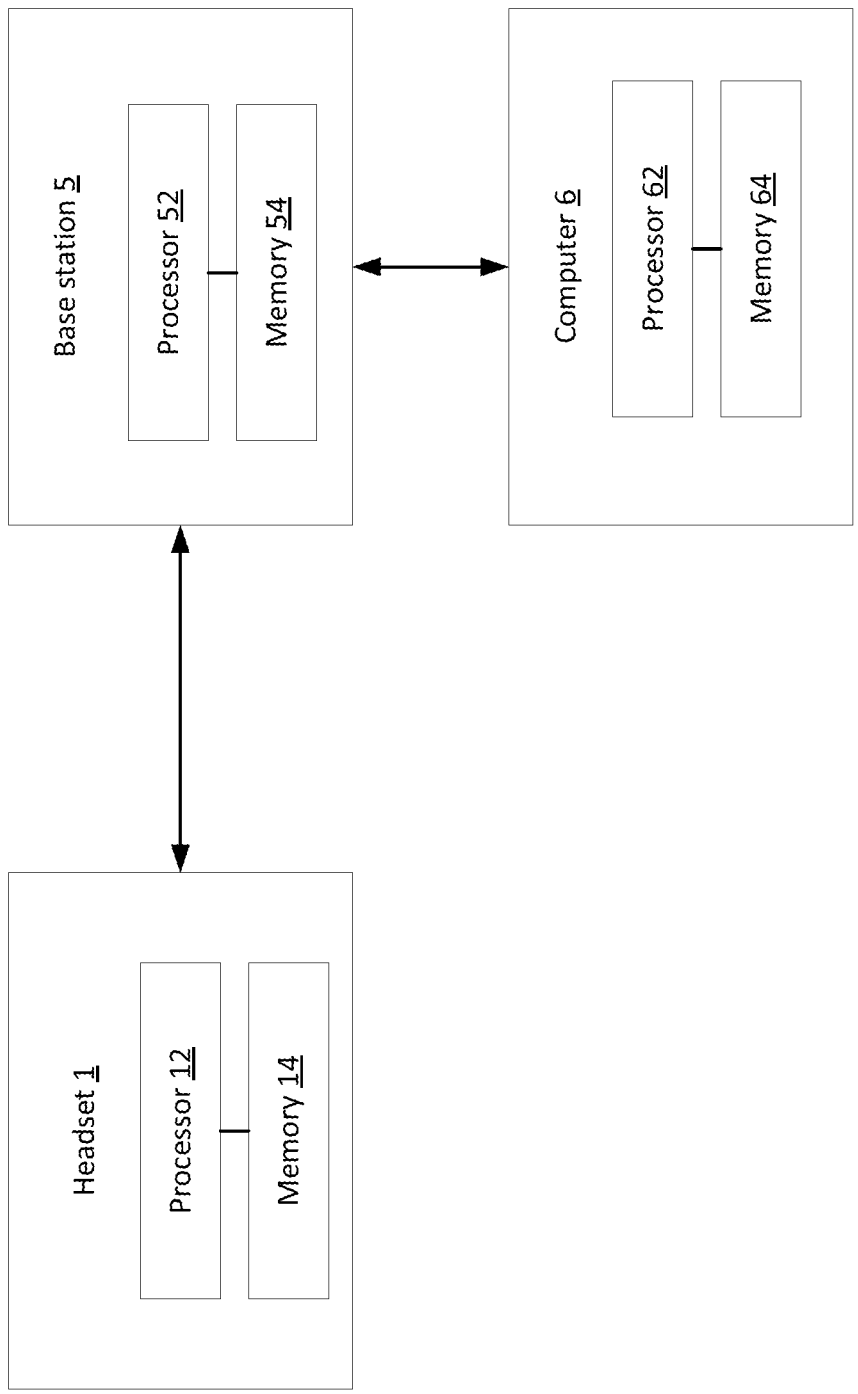
FIG. 1B is a system block diagram illustrating hardware for a headset, base station, and computer, according to an embodiment.

Biofeedback is a process by which parameters of biological functioning are monitored and converted into audio, video, or other forms of subjectively discernible information for the purpose of enabling the development of volitional control over the biological system(s) being monitored. For example, the tension level of the frontalis muscle of the forehead can be recorded, and this tension level can be turned into a sound. By listening to this sound, the user can learn to develop control over this muscle and produce states of deep relaxation.

Neurofeedback is a specialized form of biofeedback in which the monitored physiologic signals are obtained by recording the electroencephalographic activity of the brain (also referred to as an EEG signal). An EEG signal can be quantified into discreet frequency sub-bands (e.g., delta, theta, alpha, beta, and gamma sub-bands). Each of these sub-bands is associated with a specific subjective characteristic experience. For example, in very general terms, the delta sub-band is associated with drowsiness and sleep; the theta sub-band is associated with dreaminess and visualization; the alpha sub-band is associated with mental relaxation; and the beta sub-band is associated with focused attention. One goal of neurofeedback training is to increase the amount of activity in one or more of these sub-bands, and/or to develop a degree of voluntary control over the sub-band, to derive benefits associated with the properties of that sub-band. For example, stress disorders can often be combated by neurofeedback training to increase the amount of activity in the alpha sub-band.

Entrainment refers to the tendency for two oscillating processes to evolve towards synchronization. In other words, the oscillating energy frequency of one system entrains the frequency of the second system. An example of this is the pendulums of two clocks mounted next to each other on a wall eventually becoming synchronized to each other. Numerous research studies have been able to link neural oscillation patterns in the brain to the time and frequency dynamics of rhythmic sound stimuli. Oscillating visual stimuli have also been known to induce EEG entrainment via the optical nerves in the eye that conduct the stimuli through the thalamus and up to the visual cortex. In addition to the visible light spectrum, more recent studies have shown that near-infrared (nIR) light can also directly entrain EEG activity through direct transcranial photobiomodulation.

Three forms of auditory entrainment signals are known: binaural beats, isochronal tones, and monaural beats. Each is briefly discussed below.

Binaural Beats. Binaural beats typically involve the use of headphones. To achieve the binaural beat, a tone of different frequency is presented to each ear through the headphone speakers. For example, if a frequency of 140 Hz is presented to one ear, and a frequency of 150 Hz is presented to the other ear, the subject will then perceive a beat frequency of 10 Hz (being the difference between the two frequencies). Note that the 10 Hz beat frequency does not actually exist is any physical medium; it is rather a subjective virtual user experience. To many, binaural beat tones are the most pleasant to listen to, but since they are virtually perceived and not conducted to the cortex by the same neural pathways as normal auditory stimuli, their entrainment capability is very slight.

Isochronal Tones. Unlike binaural beats, isochronal tones do not require the use of headphones. To achieve isochronal tones a single frequency tone is rapidly switched on and off at the desired beat frequency. The fact that these tones are sensed through the normal auditory neural pathways combined with the hard edges of rapidly switching on and off makes isochronal tones very effective at achieving entrainment. However, those same characteristics also tend to make them harsh and unpleasant to listen to for extended time.

Monaural Beats. A third form of audio entrainment is more obscure and rarely used in comparison to the first two. To achieve a monaural beat tone, two frequencies are used as with binaural beats, but these two frequencies are then electronically mixed together in an audio mixer circuit to produce a single audio signal that has the beat frequency incorporated. This single monaural beat tone can then be presented with normal speakers and does not involve the use of headphones. The monaural beat tone is as pleasant to listen to as is the binaural beat tone, but has nearly the same level of entrainment effectiveness as does isochronal tones.

Some implementations are related to enhancing the neurofeedback training process, and includes placing an integrated headset with EEG electrodes, photic LEDs, and nIR LEDs onto the subject's head. The headset can be attached, via a tethering interface cable, to a Base Station processor unit. Then, software on a computer system interfaced to the Base Station is started to enable viewing and analyzing the EEG signal from the subject. After assuring the good quality EEG signals are being obtained (e.g., by a human, by the computer system, or a combination thereof), several minutes of baseline EEG activity are recorded and the dominant EEG frequency within a band of interest, such as the alpha band, is computed. The dominant EEG frequency is used within the software to set the operating frequency of the entrainment systems. Based on the training goals and evaluation of the baseline EEG signal, a Schedule of Thresholds is entered into the software to dynamically control the entrainment intensities during the training. The neurofeedback process is initiated, and as the training is ongoing the multiple modes of entrainment systems will be independently and dynamically modulated in intensity via interface from the computer to the Base Station, for example every 15 seconds, based on the parameters of the EEG.

One or more embodiments described herein represent an improved system for incorporating multiple complimentary modes of dynamically modulated entrainment technology into the neurofeedback process to enhance effectiveness. For example, one or more embodiments include a plurality of complimentary entrainment technologies that are used with their operating frequency being determined by the dominant EEG frequency of the subject; the means to synchronize the multiple entrainment modalities; and the means to independently modulate in real time (e.g., at machine speed) the intensity of each entrainment system in response to changes in target EEG parameters; and finally, the integration of photic LEDs and nIR LEDs into a headset, which can be easily placed onto the subject.

For example, FIG. 1A is a diagram of a multi-function custom headset to implement the features discussed herein, according to an embodiment. As shown in FIG. 1A, a headset 1 incorporates EEG electrodes 2 and LED emitters 3 and 4 into a unit that can be easily and comfortably placed onto a head of a subject. Integrated EEG electrodes 2 can be located for example at a minimum of at least four (4) active head sites, and can be made for example of dry contact conductive polymer material for ease of application.

Photic stimulation LEDs 3, sometimes referred to herein as visual LEDs, can provide visual entrainment, and can be for example white LEDs, but other LED colors may be used. Photic stimulation LEDs 3 can be located, for example and as shown in FIG. 1A, near the front of headset 1 so that a subject wearing headset 1 can see light emitted by photic stimulation LEDs 3. Although FIG. 1A shows two photic stimulation LEDs 3, in other implementations, any other number of photic stimulation LEDs can be used. In some implementations, photic stimulation LEDs 3 are part of headset 1 and not, for example, a separate structure. In some implementations, photic stimulation LEDs 3 are located so that light emitted from the photic stimulation LEDs 3 is in the subject's field of view.

nIR (near infra-red) photobiomodulatoin LEDs 4 can provide functional cortical entrainment. Any number of nIR LEDs 4 can be used, such as the six nIR LEDs 4 shown in FIG. 1A. The nIR LEDs 4 can include LEDs near a front of the headset, near a back of the headset, near a side of the headset, and/or the like. In some implementations, nIR LEDs 4 includes nIR LEDs that are not visible to a subject when wearing headset 1. Using both photic stimulation LEDs 3 and nIR LEDs 4 can accelerate the speed at which brainwave self-regulation obtained. Some known techniques take 21-40 years to master (e.g., achieve with a minimum predetermined percentage of success) brainwave self-regulation. By using photic stimulation LEDs 3 and nIR LEDs 4 in addition to audio entrainment, accelerated results can be achieved.

Base station processor module 5 can provide a computer interface, EEG amplification, and audio/video entrainment generation. Computer system 6 can store and execute neurofeedback and entrainment software applications.

In use, a subject can wear the headset 1 and activate the rest of the system by a user interface (not shown) of the computer system 6 to access the neurofeedback and entrainment software applications. These neurofeedback and entrainment software applications can send signals to the base station 5 to cause the base station 5 to send signals to the photic stimulation LEDs 3 and nIR photobiomodulatoin LEDs 4 to activate these devices. As used herein, in some implementations, a "signal" refers to an electronic signal.

Although FIG. 1A shows a particular embodiment of the headset and the rest of the system, other embodiments for placing LEDs into modules placed on the head are possible. In some implementations, headset 1 can include built-in speakers. The speakers can be used to output audio to a subject wearing headset 1. In some implementations, headset 1 does not include speakers. If headset 1 does not include built-in speakers, in some implementations, audio (e.g., monaural beat tone) can be output to the subject by speakers separate from headset 1 (e.g., but connected to headset 1 via a wired and/or wireless connection), such as surround sound stereo speakers in a room, earbuds, and/or the like; the command to output the audio can be received at those speakers from headset 1, base station 5, and/or computer 6. In some implementations, headset 1 is connected to base station 5 and/or computer 6 via a wire. In some implementations, headset 1 is wirelessly connected to base station 5 and/or computer 6. In some implementations, the functionality of base station 5 and computer 6 are combined; said differently, a single compute device can perform the functionalities of base station 5 and computer 6 described herein.

As illustrated in FIG. 1B, headset 1, base station 5, and computer 6 can each include a processor operatively coupled to memory (e.g., via a system bus). Headset 1 can include processor 12 operatively coupled to memory 14, base station 5 can include processor 52 operatively coupled to memory 54, and computer 6 can include processor 62 operatively coupled to memory 64.

The processors 12, 52, 62 can be, for example, a hardware based integrated circuit (IC), or any other suitable processing device configured to run and/or execute a set of instructions or code. For example, the processors 12, 52, 62 can be a general-purpose processor, a central processing unit (CPU), an accelerated processing unit (APU), an application specific integrated circuit (ASIC), a field programmable gate array (FPGA), a programmable logic array (PLA), a complex programmable logic device (CPLD), a programmable logic controller (PLC) and/or the like. In some implementations, the processors 12, 52, 62 can be configured to run any of the methods and/or portions of methods discussed herein.

The memories 14, 54, 64 can be, for example, a random-access memory (RAM), a memory buffer, a hard drive, a read-only memory (ROM), an erasable programmable read-only memory (EPROM), and/or the like. In some instances, the memories 14, 54, 64 can store, for example, one or more software programs and/or code that can include instructions to cause the processors 12, 52, 62, respectively, to perform one or more processes, functions, and/or the like. In some implementations, the memories 14, 54, 64 can include extendable storage units that can be added and used incrementally. In some implementations, the memory 14, 54, and/or 64 can be a portable memory (e.g., a flash drive, a portable hard disk, and/or the like) that can be operatively coupled to processor 12, 52, and/or 62. In some instances, the memories 14, 54, and/or 64 can be remotely operatively coupled with a compute device (not shown).

FIG. 2 is a system block diagram of a base station processor module, according to an embodiment. The base station processor module 101 includes digital sine wave synthesizers 102, mixer 103, phase synchronizer 105, optical LED driver 106, nIR LED driver 108 and EEG amplifier 111. Each digital sine wave synthesizer 102 is coupled to mixer 103, which is coupled to phase synchronizer 105, which is in turn coupled to optical LED driver 106 and nIR LED driver 108. Mixer 103 is also coupled to speakers (not shown in FIG. 2). Similarly, optical LED driver 106 and nIR LED driver 108 are coupled to an optical LED (e.g., photic stimulation LED 3 from FIG. 1A; not shown in FIG. 2) and nIR LED (e.g., nIR LED 4 from FIG. 1A; not shown in FIG. 2), respectively. EEG amplifier 111 is coupled to EEG electrodes, and receives a signal representing EEG electrodes in 110 from the EEG electrodes. Digital sine wave synthesizers 102, mixer 103, phase synchronizer 105, optical LED driver 106, and nIR LED driver 108 are coupled to computer 113 via bus 112. EEG amplifier 110 is coupled to computer 113 via a different connection.

In use, digital sine wave synthesizers 102 and mixer 103 collectively generate a monaural audio beat entrainment signal based on signals received from computer 113 (via software being executed at computer 130). In particular, each digital sine wave synthesizer 102 generates a synthesized sine wave and sends the synthesized sine waves to the mixer 103. Analog audio mixer system 103 receives and combines these two synthesized sine waves into a single monaural beat audio entrainment signal 104, which is sent to the speakers for output by the speakers. Using a monaural beat audio instead of, for example, binaural beats or isochronal tones can be desirable in some situations because headphones are not needed, a more pleasant sound is produced, and/or a high entrainment effectiveness is achieved.

Analog phase synchronizer circuit 105 also receives single monaural beat audio entrainment signal 104 and synchronizes visual entrainments to the beat amplitude energy peaks of the waveform of the monaural audio beat entrainment signal 104. More specifically, the output from analog phase synchronizer circuit 105 is sent to optical LED driver 106 and nIR LED driver 108, which send a photic entrainment signal 107 and an nIR entrainment signal 109, respectively, to the optical LEDs and nIR LEDs, respectively. The photic entrainment signal 107 and the nIR entrainment signal 109 each has a modulation of frequency and amplitude as defined by the control software stored and executing on computer 113. The EEG amplifier 110 receives signals from EEG electrodes in 110 and amplifies those signals before sending the amplified signals to the computer system 113 via a computer interface (e.g., a USB connection). The computer system 113 can analyze these amplified signals to define the signals sent to the sine wave synthesizers 102, the optical LED driver 106 and nIR LED driver 108 as described herein.

The pair of digital sine wave synthesizers 102 generate the two tones used for producing a monaural audio beat signal. These synthesizers 102 can be capable, for example, of having a range from at least 80 Hz up to 4 KHz with a resolution and accuracy of at least +/−0.001 Hz. These two tones can have a difference in frequency that is substantially equal (e.g., within +/−0.1 Hz, within 1%, within 5%, within 10%, and/or the like) to the desired entrainment frequency, and the desired entrainment frequency value can be derived from the dominant EEG frequency of the subject in the EEG band of interest. The two tones are summed together with an audio mixer circuit 103, and the output from this mixer 103 is monaural audio beat entrainment signal 104, which is then as mentioned above sent to an audio amplifier (not shown) and finally presented to the subject with a pair of speakers or earphones (not shown in FIG. 2).

FIG. 3 illustrates waveforms produced in a method of monaural beat audio tone generation, according to an embodiment. As shown in FIG. 3, a sine wave 201 can have a first frequency (referred to in FIG. 3 as a "Sine wave Freq. 1") and can be generated by a sine wave synthesizer (e.g., a sine wave synthesizer 102 shown in FIG. 2). Similarly, a sine wave 202 can have a second frequency (referred to in FIG. 3 as a "Sine wave Freq. 2") and can be generated by a different sine wave synthesizer (e.g., a different sine wave synthesizer 102 shown in FIG. 2). The frequency of the sine wave 201 and the frequency of the sine wave 202 can be selected to produce a signal with a desired entrainment frequency. For example, the frequency of the sine wave 201 can be N and the frequency of the sine wave 202 can be N+n, where "n" is the desired entrainment frequency derived from an analysis of the EEG dominant frequency. These two sine waves 201, 202 can be input into an audio mixer 203 to combine the two sine waves 201, 202 into a single monaural audio beat entrainment tone 204, which is amplified by audio amplifier 205 based on a control signal received from the computer system (not shown in FIG. 3) storing and execution software. The audio amplifier 205 can dynamically modulate the volume (amplitude) of the monaural beat entrainment tone 204 in response to changes in the parameters of the real time EEG signal (e.g., frequency, power ratio, envelope correlation, wave correlation, phase correlation, wave consistency, phase consistency, amplitude, and/or the like), as determined by the computer system and its software. Speakers 206 output the monaural beat entrainment tone to the subject.

When a monaural beat entrainment tone 204 is generated in this way, the two tones 201, 202 are started, and then the beat frequency manifests at the output of the monaural audio mixer 205 after the two tones are combined. There is little to no ability to control where on the time scale the peaks of the beat tone are going to appear, the beats simply appear as a result of mixing the two tones. The other modes of entrainment (photic pulses and nIR pulses) that will be used in this system, however, should be substantially synchronized with the audio amplitude peaks of the monaural beat tone, as shown in and described herein with respect to FIG. 3.

FIG. 4 illustrates waveforms produced in the method of synchronizing the LED entrainment signals to the audio energy peaks of the monaural beat entrainment signal waveform, according to an embodiment. As shown in FIG. 4, the synthesized monaural beat entrainment tone 301 is first rectified with a half-wave rectifier (not shown in FIG. 4) to produce full-wave rectified 302. This full-wave rectified 302 is then processed through, for example, a minimal phase shift low-pass filter (not shown) to produce filtered signal 303. The filtering method can be of any type to produce a smooth output envelope that accurately tracks the peaks in the monaural beat tone 301, and to produce a phase delay for example of less than, for example, 2.0 milliseconds in the frequency range from 1.0 Hz up to 40 Hz. For example, the filter can be a third-order Bessel filter with center frequency of 50 Hz. Such a filter can be used when the frequencies of the two root tones (not shown in FIG. 4) used to create the monaural beat tone 302 are selected to be at least three times the center frequency of the low-pass filter. This rectified and smoothed signal 303 is then used to drive an analog-threshold-based comparator circuit (not shown) that generates a logic '1' output state when the threshold 304 is exceeded, and logic '0' output otherwise. The result of the comparator output is an entrainment logic control signal 305 that is in phase alignment with the energy peaks of the monaural beat audio entrainment tone 301. This entrainment logic control signal 305 is then used to pulse ON and OFF the photic LED and nIR LED entrainment signal drivers (not shown in FIG. 4).

The exact frequency of the two since wave tone frequencies is not critical, but should be chosen to be complimentary to other tones that may be employed for the neurofeedback process, and should be aesthetically pleasing (e.g., to the subject; not rejected by the subject; sound or acoustic aesthetic quality of the neurofeedback tones). It can be more desirable, however, to select the particular frequency of the resulting monaural beat entrainment tone. The entrainment process is more efficient when the fundamental frequencies of the two processes are matched. In one or more embodiments, the entrainment frequency is set equal to the same frequency as the dominant energy of the subject within the target EEG sub-band with an accuracy of at least +/−0.1 Hz.

There are various techniques that can be used for measuring the dominant frequency of the EEG. A method of one or more embodiments is the use of the Fast Fourier Transform (FFT) according to the following example procedure: a circular buffer is maintained sufficient to hold 10 seconds of digitized EEG signal. At a sample rate of 250 samples per second, every second 250 new samples are added and the oldest 250 samples are removed. In this way the buffer holds the digitization of the most recent 10 seconds of EEG signal. Once per second an FFT is computed on the digitized EEG data in this buffer. Being a 10 second buffer, this means that the resulting FFT output will have a frequency resolution of 0.1 Hz. At least a minimum of five FFT transforms will be performed and then averaged together to derive the final determination of the dominant EEG frequency.

If, for example, the target sub-band for neurofeedback training is the alpha sub-band, then with each computed FFT the 0.1 Hz output bins for the frequencies within the alpha sub-band are scanned, for example from 8.0 to 13.0 Hz. The FFT bin within the target sub-band having the largest magnitude is selected to represent the dominant frequency within the target sub-band and this frequency is then used to set the entrainment frequency of the system. The monaural audio beats, the photic stimulation LEDs, and the nIR photobiomodulation LEDs will all operate at this frequency and also be aligned in phase as described above.

Within known entrainment systems, the entrainment frequency is set to a nominal value intended to represent the "optimum" typical dominant frequency of the target sub-band. So, for example, alpha entrainment is often accomplished by simply setting the entrainment frequency to 10.0 Hz. However, if the dominant frequency within the alpha sub-band for the subject in question is actually 9.5 Hz, then that 0.5 Hz difference can significantly degrade the entrainment effectiveness. For this reason, in one or more embodiments herein, one implementation is to first measure and determine the dominant EEG frequency to a high degree of accuracy (e.g., within 1% accurate, within 5% accurate, within 10% accurate, and/or the like), and to then use this as the operating frequency for an entrainment system having multiple complimentary synchronized entrainment modes.

Within one or more embodiments described herein, it is not anticipated that the entrainment frequency will be changed once the neurofeedback/entrainment session has started for the following reasons. First, it can be desirable that the entrainment frequency be stable for optimal entrainment to occur. Sometimes, at least several minutes before entrainment starts to occur, and if during this time there is a change to the entrainment frequency, the typical time to achieve entrainment is increased accordingly as the process basically restarts for the new frequency. Second, while the dominant frequency can vary over time during normal-resting EEG, once the entrainment process has taken effect, the EEG frequency will be "entrained" to the entrainment frequency and there will be very little, if any variation after that making ongoing adjustments to the entrainment frequency unnecessary. Finally, if spontaneous EEG frequency fluctuations were to occur during entrainment, and the entrainment system were to be so designed as to detect and adjust to and track those fluctuations, the potential for a run-away feedback loop would exist that could result in driving the EEG into potentially undesirable conditions.

While it can be desirable that the entrainment frequency of the one or more systems described herein be stable during a session for a subject, a feature is that the intensity of each of the entrainment modalities will be independently and dynamically modulated in real time according to ongoing EEG parameters associated with the neurofeedback process (e.g., frequency, power ratio, envelope correlation, wave correlation, phase correlation, wave consistency, phase consistency, amplitude, phase coherence, and/or the like). While many means exist by which the intensity of the entrainment signals can be modulated, one method is the use of digitally controlled resistors. This method provides, for example, a typical resolution of 256 discreet steps of entrainment intensity operating under computer control. The computer software can then monitor the target EEG parameters of the neurofeedback training and set the intensity of each of the entrainment modalities accordingly. In an embodiment of the current system, the entrainment intensities are updated for example every 15 seconds based on an analysis of most recent 15 seconds of EEG training data.

There are several scenarios for how the intensity of the entrainment signals can be modulated in relation to the EEG training parameters. For example, it would be possible to employ a percentage calculation. In some implementations, the percentage calculation is a percentage calculation of baseline amplitude averages compared to target goal averages. For example, if the goal is to increase the two minute amplitude baseline average by 5%, the entrainment signals can be utilized until the desired average increase percentage calculation is reached. Additionally or alternatively, an AI system could be used which would employ algorithms to make changes to the entrainment and then monitor the results. The AI system could be, for example, a neural network trained to receive EEG signals as input and produce an output indicating what entrainment intensities should be used. Another method is to use a "Schedule of Thresholds," which is set in advance within the computer software to specify the entrainment intensities for various ranges of the training parameter.

FIG. 5 illustrates an example of a Schedule of "% of Training Goal" to "Entrainment Intensity", according to an embodiment. As shown in FIG. 5, the Threshold Schedule can represent, for example, a situation where the neurofeedback training goal was to increase the integrated amplitude voltage of the EEG alpha sub-band by 25 micro volts. As can be seen by this Schedule, when the training results are exhibiting low voltages (e.g., less than 25 micro volts), then the entrainment parameters are set to have higher intensities. As training progresses and greater success at achieving higher alpha amplitude is observed (e.g., getting closer to 25 micro volts), then the intensities of the entrainment parameters is reduced. In this way, during the early stages of training when the alpha amplitude is low, the entrainment intensity is high to provide maximum facilitation of the alpha production. As training progress and alpha voltages increase, the entrainment intensity is successively reduced automatically by the computer software. When the subject is able to attain a predetermined threshold of alpha voltages (e.g., greater than 70% of 25 micro volts), the entrainment is completely off to assure that the subject is capable of sustaining this level on their own without the entrainment assistance. If, however, the alpha voltages drop below the predetermined threshold, the entrainment can turn back on.

FIG. 6 illustrates a flowchart of a method 600 to generate cause audio output and LED activation/deactivation, according to an embodiment. In some implementations, method 600 is performed by a processor (e.g., processor 52 and/or 62).

At 602, a first signal (e.g., sine wave frequency 1 in FIG. 3 and/or generated by sine wave synth 1 102 in FIG. 2) having a first frequency is generated. At 604, a second signal (e.g., sine wave frequency 2 in FIG. 3 and/or sine wave synth 2 102 in FIG. 2) is generated having a second frequency. A difference between the first frequency and the second frequency can be substantially equal to a dominant EEG frequency associated with (e.g., determined based on EEG activity of) a subject. In some implementations, although FIG. 6 shows 602 occurring before 604, in other implementations, 604 can occur prior to and/or in parallel with 602.

At 606, a third signal (e.g., monaural audio beats out 104 in FIG. 2, monaural beat tone 204 in FIG. 3, monaural beat 301 in FIG. 4) is generated based on the first signal and the second signal. In some implementations, 606 occurs automatically (e.g., without human intervention) in response to completing 602 and 604.

At 608, a fourth signal (e.g., photic entrainment out 107 and nIR entrainment out 109 in FIG. 2, synchronous LED drive 305 in FIG. 4) is generated based on the third signal. In some implementations, 608 occurs automatically (e.g., without human intervention) in response to completing 606.

At 610, audio representing the third signal is caused to be output. For example, the third signal can be sent to a speaker that is configured to output the audio in response to receiving the third signal. In some implementations, 610 occurs automatically (e.g., without human intervention) in response to completing 608.

At 612, a plurality of LEDs (e.g., LED emitters 3 and 4 in FIG. 1) included in a headset (e.g., headset 1 in FIG. 1) are caused, while outputting the audio representing the third signal at 610, to activate and deactivate based on the fourth signal. Thus, in some implementations, 610 and 612 occur in parallel. Causing the plurality of LEDs to activate and deactivate can include sending the fourth signal to the plurality of LED, where the plurality of LEDs is configured to activate and deactivate in accordance with the fourth signal (e.g., activate when the fourth signal is "high" and deactivate when the fourth signal is "low"). In some implementations, 612 occurs automatically (e.g., without human intervention) in response to completing 608.

In some implementations of method 600, the audio is output at the headset.

In some implementations of method 600, the plurality of LEDs includes a near-infrared (nIR) LED (e.g., nIR LED 4) and a visual LED (e.g., photic stimulation LED 3).

Some implementations of method 600 further include rectifying the third signal to generate a rectified signal (e.g., full wave rectified 302 in FIG. 4). Some implementations of method 600 further include filtering the rectified signal to generate a filtered signal (e.g., filtered 303). Some implementations of method 600 further include identifying peaks of the filtered signal having a value greater than a predetermined threshold value (e.g., threshold 304). The generating the fourth signal at 608 can be based on the filtered signal and the peaks of the filtered signal.

Some implementations of method 600 further include monitoring a neurofeedback training progress of the subject. For example, a voltage can be measured to determine if the voltage is getting closer to or further from a predetermined target voltage. Some implementations of method 600 further include adjusting an intensity of at least one of the audio or at least one LED from the plurality of LEDs based on the neurofeedback training progress.

In some implementations of method 600, EEG signals of the subject are captured during a training session (e.g., a session where a subject is training to have a predetermined part of his brain achieve a particular voltage) and the difference between the first frequency and the second frequency does not change during the training session.

In some implementations of method 600, the audio is a monoaural beat tone.

In some implementations of method 600, the generating third signal at 606 includes summing the first signal and the second signal.

In some implementations of method 600, the headset includes a plurality of EEG electrodes (e.g., EEG electrodes 2 in FIG. 1) configured to capture an EEG signal from the subject. The dominant EEG frequency can be determined based on the EEG signal.

FIG. 7 shows a flowchart of a method 700 to output audio and activate/deactivate LEDs based on a dominant EEG frequency, according to an embodiment.

In some implementations, method 700 is performed by a processor (e.g., processor 12, 52, and/or 62).

At 702, an audio signal (e.g., monaural audio beats out 104 in FIG. 2, monoaural beat tone 204 in FIG. 3, monoaural beat 301 in FIG. 4) is sent to a speaker to cause the speaker to output audio based on the audio signal. The audio signal is generated based on combining a first signal (e.g., sine wave frequency 1 in FIG. 3 and/or generated by sine wave synth 1 102 in FIG. 2) having a first frequency and a second signal (e.g., sine wave frequency 2 in FIG. 3 and/or sine wave synth 2 102 in FIG. 2) having a second frequency. A difference between the first frequency and the second frequency is substantially equal to a dominant EEG frequency associated with (e.g., determined based on EEG activity of) a subject.

At 704, a LED drive signal (e.g., photic entrainment out 107 and nIR entrainment out 109 in FIG. 2, synchronous LED drive 305 in FIG. 4) is sent to a plurality of LEDs to cause the plurality of LEDs to activate based on the LED drive signal. The LED drive signal can be generated based on peaks associated with the audio signal.

In some implementations of method 700, the plurality of LEDs includes a near-infrared (nIR) LED (e.g., nIR LED 4) and a visual LED (e.g., photic stimulation LED 3).

In some implementations of method 700, method 700 is performed by a headset (e.g., headset 1 in FIG. 1).

Some implementations of method 700 further include generating the LED drive signal by: rectifying the audio signal to generate a rectified signal (e.g., full wave rectified 302); filtering the rectified signal to generate a filtered signal (e.g., filtered 303); identifying peaks of the filtered signal having a value greater than a predetermined threshold value (e.g., threshold 304); and generating the LED drive signal based on the filtered signal and the peaks of the filtered signal.

In some implementations of method 700, a neurofeedback training progress of the subject is monitored (e.g., percentage (%) training goal as shown in FIG. 5) and method 700 further includes adjusting an intensity of the audio signal and the plurality of LEDs based on the neurofeedback training progress.

In some implementations of method 700, method 700 is performed by an apparatus that includes EEG electrodes (e.g., EEG electrodes 2). The EEG electrodes can be configured to capture EEG signals of the subject during a training session, and the difference between the first frequency and the second frequency do not change during the training session.

In some implementations of method 700, the audio signal represents a monoaural beat tone.

In some implementations of method 700, method 700 is performed by an apparatus that includes EEG electrodes (e.g., EEG electrodes 2). The EEG electrodes are configured to capture an EEG signal from the subject. The dominant EEG frequency can be determined based on the EEG signal.

FIG. 8 shows a flowchart of a method 800 to output audio and activate/deactivate LEDs based on a dominant EEG frequency, according to an embodiment. In some implementations, method 800 is performed by a processor (e.g., processor 12, 52, and/or 62).

At 802, an audio signal (e.g., monaural audio beats out 104 in FIG. 2, monoaural beat tone 204 in FIG. 3, monoaural beat 301 in FIG. 4) is sent to a speaker to cause the speaker to output audio based on the audio signal. The audio signal is generated based on a first signal (e.g., sine wave frequency 1 in FIG. 3 and/or generated by sine wave synth 1 102 in FIG. 2) having a first frequency and a second signal (e.g., sine wave frequency 2 in FIG. 3 and/or sine wave synth 2 102 in FIG. 2) having a second frequency. A difference between the first frequency and the second frequency is substantially equal to a dominant EEG frequency associated with (e.g., determined based on EEG activity of) a subject.

At 804, a LED drive signal (e.g., photic entrainment out 107 and nIR entrainment out 109 in FIG. 2, synchronous LED drive 305 in FIG. 4) is sent to a plurality of LEDs to cause the plurality of LEDs to activate based on the LED drive signal. The LED drive signal is generated based on the audio signal.

In some implementations of method 800, the audio signal and the LED drive signal are sent at first time and method 800 further includes determining, at a second time that is between five seconds and 59 seconds after the first time, whether to update at least one of an intensity of the audio signal or an intensity of the LED drive signal.

Some implementations of method 800 further include rectifying the audio signal to generate a rectified signal (e.g., full wave rectified 302), filtering the rectified signal to generate a filtered signal (e.g., filtered 303), identifying peaks of the filtered signal having a value greater than a predetermined threshold value (e.g., threshold 304), and generating the LED drive signal based on the filtered signal and the peaks of the filtered signal.

Some implementations are related to a system and device for enhancing the neurofeedback training process based on use of an integrated headset and a plurality of entrainment modalities. In some implementations, one of the entrainment modalities is monaural beat audio entrainment. In some implementations, one of the entrainment modalities is visual photic LED entrainment. In some implementations, one of the entrainment modalities is pulsed nIR LED entrainment. In some implementations, EEG electrodes, the visual photic LED, and nIR LED are integrated into a self-contained headset.

Some implementations are related to a system and device for enhancing the neurofeedback training process utilizing a Base Station device configured to perform at least the following functionality: a bank of at least 4 EEG amplifier channels, with analog to digital (A-D) conversion, to supply digitized EEG signals to a computer system software application; a pair of precision digital sine wave synthesizers with a resolution and accuracy of at least +/−0.001 Hz, operating under computer software control for producing a monaural beat audio entrainment tone; a pair of LED driver circuits capable of independently driving the visual photic LED and nIR entrainment LED with precision frequency and intensity under computer software control; a method of synchronizing the flashes of the entrainment LEDs with the audio energy peaks of the monaural beat audio entrainment signal; and a computer interface system to allow for precision software control over entrainment frequencies and intensities independently for each entrainment modality.

In some implementations, means are employed to assure that all entrainment modalities operate at the identical frequency and in precise synchronous phase alignment in time.

In some implementations, the operating frequency of the entrainment modalities is set equal to the dominant frequency of the EEG in the target training sub-band of the EEG with a minimum accuracy of at least +/−0.1 Hz, and this frequency is not adjusted during the training session.

In some implementations, each of the entrainment modalities can be independently and precisely modulated in intensity under computer software control in accordance with changes in the target EEG training parameters.

In some implementations, the entrainment intensities are updated at the end of discreet training epochs which are not less than 5 seconds, or greater than 1 minute, and are preferably 15 seconds in duration.

In some implementations, the entrainment intensities are modulated in accordance with parameters of a preset protocol, preferably in the form of a Schedule of Thresholds that is set within the computer software.

Combinations of the foregoing concepts and additional concepts discussed here (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The skilled artisan will understand that the drawings primarily are for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

To address various issues and advance the art, the entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. As such, all examples and/or embodiments are deemed to be non-limiting throughout this disclosure.

It is to be understood that the logical and/or topological structure of any combination of any program components (a component collection), other components and/or any present feature sets as described in the Figures and/or throughout are not limited to a fixed operating order and/or arrangement, but rather, any disclosed order is an example and all equivalents, regardless of order, are contemplated by the disclosure.

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

Embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "substantially" when used in conjunction with numerical values and/or ranges generally refer to those numerical values and/or ranges near to a recited numerical value and/or range. For example, in some instances, "substantially 40 [units]" can mean within ±25% of 40 (e.g., from 30 to 50). In some instances, the term "substantially" can mean within ±10% of the recited value. In other instances, the term "substantially" can mean within ±9%, ±8%, ±7%, ±6%, ±5%, ±4%, ±3%, ±2%, ±1%, less than ±1%, or any other value or range of values therein or therebelow. Furthermore, although a numerical value modified by the term "substantially" can allow for and/or otherwise encompass a tolerance of the stated numerical value, it is not intended to exclude the exact numerical value stated.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Some embodiments and/or methods described herein can be performed by software (executed on hardware), hardware, or a combination thereof. Hardware modules may include, for example, a processor, a field programmable gate array (FPGA), and/or an application specific integrated circuit (ASIC). Software modules (executed on hardware) can include instructions stored in a memory that is operably coupled to a processor, and can be expressed in a variety of software languages (e.g., computer code), including C, C++, Java™, Ruby, Visual Basic™, and/or other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may include a single computer-readable statement or many computer-readable statements.

While specific embodiments of the present disclosure have been outlined above, many alternatives, modifications, and variations will be apparent to those skilled in the art. Accordingly, the embodiments set forth herein are intended to be illustrative, not limiting.

What is claimed is:

1. A method, comprising:
   generating, via a processor, a first signal having a first frequency;
   generating, via the processor, a second signal having a second frequency, a difference between the first frequency and the second frequency being substantially equal to a dominant electroencephalogram (EEG) frequency derived from a subject;
   generating, via the processor, a third signal based on the first signal and the second signal;
   rectifying, via the processor, the third signal to generate a rectified signal;
   filtering, via the processor, the rectified signal to generate a filtered signal;

identifying, via the processor, peaks of the filtered signal having a value greater than a predetermined threshold value;

generating, via the processor and based on the filtered signal and the peaks of the filtered signal, a fourth signal based on the third signal;

causing, via the processor, audio generated based on the third signal to be output; and causing, via the processor and while outputting the audio representing the third signal, a plurality of light emitting diodes (LEDs) included at a headset to activate and deactivate based on the fourth signal.

2. The method of claim 1, wherein the audio is output at the headset.

3. The method of claim 1, wherein the plurality of LEDs includes a near-infrared (nIR) LED and a visual LED.

4. The method of claim 1, further comprising:
monitoring, via the processor, a neurofeedback training progress of the subject; and
adjusting, via the processor, an intensity of at least one of the audio or at least one LED from the plurality of LEDs based on the neurofeedback training progress.

5. The method of claim 1, wherein EEG signals of the subject are captured during a training session and the difference between the first frequency and the second frequency does not change during the training session, the training session being a predefined period of neurofeedback training.

6. The method of claim 1, wherein the audio is a monoaural beat tone.

7. The method of claim 1, wherein the generating third signal includes summing the first signal and the second signal.

8. The method of claim 1, wherein the headset includes a plurality of EEG electrodes configured to capture an EEG signal from the subject, the dominant EEG frequency determined based on the EEG signal.

9. An apparatus, comprising:
a memory; and
a processor operatively coupled to the memory, the processor configured to:
send an audio signal to a speaker to cause the speaker to output audio based on the audio signal, the audio signal generated based on combining a first signal having a first frequency and a second signal having a second frequency, a difference between the first frequency and the second frequency being substantially equal to a dominant electroencephalogram (EEG) frequency derived from a subject; and
send a light emitting diode (LED) drive signal to a plurality of LEDs to cause the plurality of LEDs to activate based on the LED drive signal, the LED drive signal generated by
rectifying the audio signal to generate a rectified signal,
filtering the rectified signal to generate a filtered signal,
identifying peaks of the filtered signal having a value greater than a predetermined threshold value, and
generating the LED drive signal based on the filtered signal and the peaks of the filtered signal.

10. The apparatus of claim 9, wherein the plurality of LEDs includes a near-infrared (nIR) LED and a visual LED.

11. The apparatus of claim 9, wherein the apparatus is a headset.

12. The apparatus of claim 9, wherein a neurofeedback training progress of the subject is monitored and the processor is further configured to:
adjust an intensity of the audio signal and the plurality of LEDs based on the neurofeedback training progress.

13. The apparatus of claim 9, further comprising:
EEG electrodes operatively coupled to the processor, the EEG electrodes configured to capture EEG signals of the subject during a training session, the difference between the first frequency and the second frequency not changing during the training session, the training session being a predefined period of neurofeedback training.

14. The apparatus of claim 9, wherein the audio signal is generated based on a monoaural beat tone.

15. The apparatus of claim 9, further comprising:
EEG electrodes operatively coupled to the processor, the EEG electrodes configured to capture an EEG signal from the subject, the dominant EEG frequency determined based on the EEG signal.

16. A non-transitory processor-readable medium storing code comprising instructions to be executed by one or more processors, the instructions causing the one or more processors to:
send an audio signal to a speaker to cause the speaker to output audio based on the audio signal, the audio signal generated based on a first signal having a first frequency and a second signal having a second frequency, a difference between the first frequency and the second frequency being substantially equal to a dominant electroencephalogram (EEG) frequency derived from a subject;
rectify the audio signal to generate a rectified signal;
filter the rectified signal to generate a filtered signal;
identify peaks of the filtered signal having a value greater than a predetermined threshold value;
generate a light emitting diode (LED) drive signal based on the filtered signal and the peaks of the filtered signal; and
send the LED drive signal to a plurality of LEDs to cause the plurality of LEDs to activate based on the LED drive signal, the LED drive signal generated based on the audio signal.

17. The non-transitory processor-readable medium of claim 16, wherein the audio signal and the LED drive signal are sent at first time and the instructions further comprise code to cause the one or more processors to:
determine, at a second time that is between five seconds and 59 seconds after the first time, whether to update at least one of an intensity of the audio signal or an intensity of the LED drive signal;
send a second audio signal to the speaker to cause the speaker to output audio based on the updated intensity of the audio signal in response the determination; and
send a second LED drive signal to the plurality of LEDs to cause the plurality of LEDs to activate based on the updated intensity of the LED drive signal in response the determination.

* * * * *